US010748711B2

(12) United States Patent
Konrad et al.

(10) Patent No.: US 10,748,711 B2
(45) Date of Patent: Aug. 18, 2020

(54) CAPACITOR ASSEMBLY

(71) Applicant: EPCOS AG, Munich (DE)

(72) Inventors: Juergen Konrad, Graz (AT); Markus Koini, Seiersberg (AT); Franz Rinner, Deutschlandsberg (AT)

(73) Assignee: TDK ELECTRONICS AG, Munich (DE)

( * ) Notice: Subject to any disclaimer, the term of this patent is extended or adjusted under 35 U.S.C. 154(b) by 0 days.

(21) Appl. No.: 16/090,200

(22) PCT Filed: Feb. 23, 2017

(86) PCT No.: PCT/EP2017/054214
§ 371 (c)(1),
(2) Date: Sep. 28, 2018

(87) PCT Pub. No.: WO2017/167507
PCT Pub. Date: Oct. 5, 2017

(65) Prior Publication Data
US 2019/0115156 A1    Apr. 18, 2019

(30) Foreign Application Priority Data

Mar. 31, 2016  (DE) .................. 10 2016 105 910

(51) Int. Cl.
H01G 4/30       (2006.01)
H01G 2/06       (2006.01)
(Continued)

(52) U.S. Cl.
CPC ............... H01G 4/30 (2013.01); H01G 2/065 (2013.01); H01G 4/12 (2013.01); H01G 4/232 (2013.01); H01G 4/38 (2013.01); H05K 1/141 (2013.01)

(58) Field of Classification Search
CPC .......... H01G 4/224; H01G 4/248; H01G 4/30; H01G 4/38; H01G 4/012; H01G 4/1227;
(Continued)

(56) References Cited

U.S. PATENT DOCUMENTS 4,661,884 A     4/1987  Seaman
8,896,986 B2   11/2014  Chacko et al.
(Continued)

FOREIGN PATENT DOCUMENTS

DE   102007044604 A1   4/2009
EP        3437112 A1   2/2019
(Continued)

OTHER PUBLICATIONS

AVX Advanced Ceramic Capacitors for Power Supply, High Voltage and Tip and Ring Applications, Version 16.6, AVX A Kyocera Group Company, Jan. 2016, http://catalogs.avx.com/AdvancedCeramicCapacitors.pdf.

(Continued)

Primary Examiner — Michael P McFadden
(74) Attorney, Agent, or Firm — Morgan, Lewis & Bockius LLP

(57) ABSTRACT

The present invention relates to a capacitor assembly (1) which comprises at least one ceramic multilayer capacitor (2) comprising ceramic layers (4) and first and second electrodes (5a, 5b) arranged therebetween, and a base (3). The base (3) comprises a substrate (9) and conductor tracks (10a, 10b), wherein the conductor tracks (10a, 10b) lead from a top side (11) of the substrate (9) said top side facing toward the multilayer capacitor (2), to an underside (12) of the substrate (9), said underside facing away from the multilayer capacitor (2). The multilayer capacitor (2) is mechanically secured on the base (3). The first electrodes (Continued)

(5a) and the second electrodes (5c) are electrically contacted with the conductor tracks (10a, 10b).

13 Claims, 6 Drawing Sheets

(51) Int. Cl.
*H05K 1/14* (2006.01)
*H01G 4/12* (2006.01)
*H01G 4/38* (2006.01)
*H01G 4/232* (2006.01)

(58) Field of Classification Search
CPC ...... H01G 4/1245; H01G 4/065; H01G 4/232; H05H 1/141
USPC .......................................... 361/301.4, 321.2
See application file for complete search history.

(56) References Cited

U.S. PATENT DOCUMENTS

| | | |
|---|---|---|
| 2010/0046135 A1 | 2/2010 | Niki et al. |
| 2014/0268487 A1 | 9/2014 | Yoshida |
| 2014/0284089 A1 | 9/2014 | Hattori et al. |
| 2014/0293564 A1 | 10/2014 | Murayama et al. |
| 2015/0206661 A1 | 7/2015 | Fujimura et al. |
| 2016/0007446 A1* | 1/2016 | Ishikawa ................ H05K 1/113 174/260 |
| 2016/0309578 A1* | 10/2016 | Park ...................... H01G 4/248 |

FOREIGN PATENT DOCUMENTS

| | | |
|---|---|---|
| JP | H07106751 A | 4/1995 |
| JP | 2006186167 A | 7/2006 |
| JP | 2010161172 A | 7/2010 |
| JP | 2014053588 A | 3/2014 |
| JP | 2014179512 A | 9/2014 |
| JP | 2014187322 A | 10/2014 |
| JP | 2014192386 A | 10/2014 |
| WO | WO-2017167507 | 10/2017 |

OTHER PUBLICATIONS

TDK Data Sheets, CeraLink(TM) capacitor for fast-switching semiconductors, Low profile (LP) series, Feb. 8, 2016,Version 2.1, http://en.tdk.eu/tdk-en/1054426/products/product-catalog/ceramic-capacitors/ceralink-capacitors.

TDK Data Sheets, CeraLink(TM) capacitor for fast-switching semiconductors, Solder pin (SP) series, Feb. 19, 2015,Version 1.1, http://en.tdk.eu/tdk-en/1054426/products/product-catalog/ceramic-capacitors/ceralink-capacitors.

TDK Tech Notes, Flex Crack Countermeasures in MLCCs (Multilayer Ceramic Chip Capacitors), last retrieved Jul. 14, 2016, https://product.tdk.com/info/en/products/capacitor/ceramic/nlcc/technote/solution/mlcc02/index.html.

TDK Tech Notes, Solder Crack Countermeasures in MLCCs (Multilayer Ceramic Chip Capacitors), last retrieved Jul. 14, 2016, https://product.tdk.com/info/en/products/capacitor/ceramic/nlcc/technote/solution/mlcc01/index.html.

* cited by examiner

Fig. 11

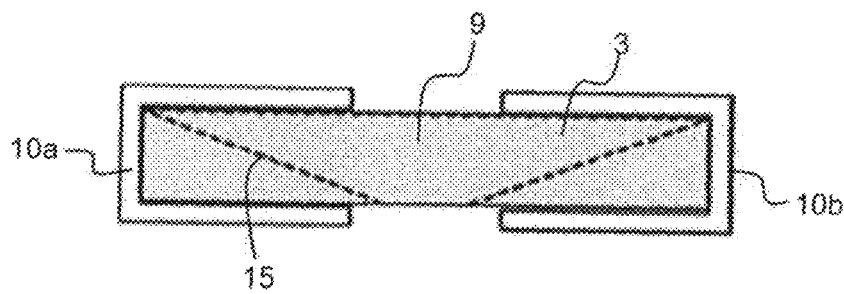

Fig. 12

| | capacitor assembly 1 | capacitor assembly 2 | capacitor assembly 3 | capacitor assembly 4 | comparative example |
|---|---|---|---|---|---|
| chip width (mm) | 7.8 | 7.8 | 10.0 | 10.0 | 6.8 |
| chip height | 6.8 | 6.8 | 5.3 | 5.3 | 7.8 |
| chip thickness (mm) | 2.6 | 2.6 | 2.6 | 2.6 | 2.6 |
| External fixing (substrate with conductor track or leadframe) | AlOx with Cu | SiN with Cu | AlOx with Cu | SiN with Cu | Cu |
| ceramic thickness of substrate (mm) | 1.0 | 0.6 | 1.0 | 0.6 | — |
| conductor track thickness (mm) | 0.3 | 0.4 | 0.3 | 0.4 | 0.3 |
| ESR (mΩ) | 1.0 | 1.0 | 0.8 | 0.8 | 0.7 |
| thermal resistance (K/W) | 8.2 | 7.8 | 8.2 | 8.2 | 8.3 |
| total width (mm) | 7.8 | 7.8 | 10 | 10 | 14.3 |
| total height (mm) | 8.2 | 8.2 | 7.7 | 7.7 | 9.4 |
| total length (mm) | 13.6 | 13.6 | 13.6 | 13.6 | 13.6 |
| space requirement (mm) | 870 | 870 | 1047 | 1047 | 1828 |

CAPACITOR ASSEMBLY

The present invention relates to a capacitor assembly. A capacitor assembly is understood hereinafter to mean an assembly comprising a multilayer capacitor and means that make it possible to mount the multilayer capacitor on a printed circuit board, in particular that make possible surface mounting of the multilayer capacitor on the surface of the printed circuit board.

Ceramic multilayer capacitors make it possible to satisfy a large number of different requirements, as a result of which they are suitable for example for use as an intermediate circuit capacitor or snubber capacitor in electrical circuits. In such a circuit, they can serve as a voltage-stabilizing component. In this case, the multilayer capacitors can serve as a buffer store for excess and/or absent charge, wherein, at a specific DC voltage level, they have to take up and/or output a demanded quantity of charge as rapidly as possible. The charge take-up capacity of the capacitors is determined by the capacitance thereof. For rapidly recurring charging processes, a high current-carrying capacity of the capacitors is demanded, particularly at high frequencies. In addition, the lowest possible inductance of a commutation circuit of the capacitor should be achieved in order to avoid overvoltage spikes during the efficient switching of semiconductors.

Furthermore, further electrical requirements are made of the multilayer capacitors. In particular, a multilayer capacitor should have low parasitic elements, such as a low equivalent series resistance ESR (equivalent series resistance) and a low parasitic inductance ESL (equivalent series inductance). Furthermore, the capacitors and their linking to a printed circuit board should have a high thermal conductivity and satisfy stringent thermomechanical requirements. By way of example, the capacitors should remain functional even in the event of large temperature changes, for example owing to a thermal shock.

The present invention is concerned in particular with the connection technology between a ceramic multilayer capacitor and a printed circuit board. In this case, a connection which has the lowest possible inductance and which offers a good electrical and thermal conductivity should be made possible. In order to satisfy these requirements, it is advantageous for a capacitor assembly to be mountable onto a printed circuit board over the largest possible area. Furthermore, however, the structural space occupied by the capacitor assembly on the printed circuit board should be as small as possible.

Accordingly, it is an object of the present invention to specify a capacitor assembly which makes possible a particularly good connection to a printed circuit board.

This object is achieved by means of a capacitor assembly according to the present claim 1.

A capacitor assembly is proposed which comprises at least one ceramic multilayer capacitor comprising ceramic layers and first and second electrodes arranged therebetween, and a base comprising a substrate and conductor tracks wherein the conductor tracks lead from a top side of the substrate, said top side facing toward the capacitor, to an underside of the substrate, said underside facing away from the capacitor, wherein the multilayer capacitor is mechanically secured on the base and wherein the first electrodes and the second electrodes are electrically contacted with the conductor tracks.

The multilayer capacitor comprises external contacts. The multilayer capacitor is designed for a single-sided connection. Accordingly, all external contacts are arranged on an outer surface of the multilayer capacitor facing toward the base. In this case, the first internal electrodes can be electrically connected to a first external contact and the second internal electrodes can be connected to a second external contact. The first and second external contacts can be arranged exclusively on the outer surface of the multilayer capacitor facing toward the base.

The arrangement of the multilayer capacitor on the base as proposed here makes it possible to ensure a high electrical and thermal conductivity between the multilayer capacitor and the base and at the same time to provide a connection having a low inductance. These properties of the connection can be made possible in particular by virtue of the fact that the mechanical connection of the multilayer capacitor to the base can also be used for electrical contacting. In this case, the multilayer capacitor can be secured in particular over a large area on the base.

Furthermore, the base can be secured on a printed circuit board by means of surface mounting. In this case, the proposed capacitor assembly enables a connection of the ceramic multilayer capacitor to the printed circuit board via the base, wherein the connection offers a good electrical and thermal conductivity, has a low inductance and necessitates only a small structural space requirement. During surface mounting, the base can bear by a large area on the printed circuit board, such that a good thermal conductivity is also present between the base and the printed circuit board. Accordingly, heat that arises in the capacitor during operation can be dissipated to the printed circuit board via the base to a sufficient extent.

The connections between the printed circuit board and the base and also between the base and the multilayer capacitor can furthermore be configured in such a way that the connections are mechanically stable and also enable a reliable electrical contacting. The connections furthermore lead to low losses since they can be configured such that they have a low inductance.

The capacitor assembly can be configured in such a way that, during surface mounting of the capacitor assembly, the base is arranged between the printed circuit board and the multilayer capacitor. The base can be in particular a DCB component (DCB=direct copper bonding) comprising a ceramic substrate with copper conductor tracks.

The combination of a ceramic multilayer capacitor with a DCB base allows a relatively simple production method in which the ceramic multilayer capacitor can be placed on the base in a simple manner. A connection between the multilayer capacitor and the base can be produced by silver sintering, for example. The large-area linking does not make stringent requirements of geometric tolerances during production and thus enables a simple process sequence.

The first and second electrodes arranged between the ceramic layers are internal electrodes of the multilayer capacitor. The multilayer capacitor can furthermore comprise external electrodes, which are also referred to as external contact, which are electrically contacted with the electrodes. The multilayer capacitor can furthermore comprise third electrodes, which are not contacted with the external electrodes and are also referred to as floating electrodes.

The substrate can comprise in particular a ceramic or dielectric material. The conductor tracks consist of a conductive material. The conductor tracks can be printed on the substrate. The multilayer capacitor can be mechanically secured on the base in such a way that it cannot be separated nondestructively from the base.

The first and the second electrodes of the multilayer capacitor in each case can bear against the outer surface of the multilayer capacitor facing toward the base.

The electrodes and the ceramic layers can be arranged one above another in a stacking direction S, wherein the stacking direction S can be perpendicular to the surface normal to the surface of the base that faces toward the multilayer capacitor.

The multilayer capacitor can comprise a first external contact and a second external contact, which are arranged on one and the same outer surface of the multilayer capacitor. The remaining outer surfaces of the multilayer capacitor can be free of external contacts. The first electrodes can be connected to one of the conductor tracks via the first external contact, and the second electrodes can be connected to one of the conductor tracks via the second external contact.

Accordingly, the multilayer capacitor can be designed for a single-sided connection, in which all external contacts are provided on a single outer surface. This outer surface is mechanically secured on the base and is electrically contacted with the base. The configuration of the multilayer capacitor for a single-sided connection enables a very simple method for producing the capacitor assembly in which the multilayer capacitor is placed onto the base.

The multilayer capacitor can bear by at least half of the first outer surface directly on the base. Such a large bearing surface of the multilayer capacitor on the base can ensure a high thermal and electrical conductivity of the connection of the multilayer capacitor to the base and provide for mechanically stable securing. Preferably, the multilayer capacitor bears by at least 75% of the first outer surface directly on the base.

The ceramic multilayer capacitor is connected to the base by a layer comprising silver. The layer can consist of pure silver to an extent of 95% by weight or even to an extent of 99% by weight. In particular, the ceramic multilayer capacitor can be connected to the base by a layer formed by applying a paste and subsequent sintering. Such a layer is also referred to as a sintering silver layer. Sintering using silver makes it possible to produce a layer which enables very stable mechanical securing of the multilayer capacitor to the base and which at the same time has a high electrical and thermal conductivity. Furthermore, the sintering silver technique makes it possible to produce a very thin layer having a thickness of 5 to 50 μm, for example.

The capacitor assembly can furthermore comprise at least one second ceramic multilayer capacitor, which likewise comprises ceramic layers and electrodes arranged therebetween and which is arranged on the base, wherein the electrodes of the second multilayer capacitor are electrically contacted with the conductor tracks. A single base can thus be used for mechanically securing and electrically contacting a multiplicity of multilayer capacitors.

The base can comprise at least one slot extending between the ceramic multilayer capacitor and the second ceramic multilayer capacitor. The slot can bring about mechanical load relief that reduces mechanical stresses caused by different coefficients of thermal expansion, for example.

The ceramic multilayer capacitor and the second ceramic multilayer capacitor can be connected in parallel with one another. The parallel connection of the multilayer capacitors results in a capacitor assembly whose total capacitance corresponds to the sum of the capacitances of the multilayer capacitors. The parallel connection thus makes it possible to design a capacitor assembly having a very high capacitance. A high capacitance is crucial for example for a high charge take-up capacity.

The capacitor assembly can be an SMD device (SMD=surface mounted device). Accordingly, the capacitor assembly can be suitable for surface mounting on a printed circuit board. In this case, the capacitor assembly can be secured on the printed circuit board for example by means of soldering or silver sintering. In particular, the capacitor assembly can be suitable for a multiplicity of different methods for surface mounting on the printed circuit board.

The capacitor assembly can be configured to be secured on a printed circuit board in such a way that the base bears by an area of at least 40 mm2 directly on a printed circuit board. By way of example, the base can bear by an area of 51.7 mm2 on the printed circuit board.

The material and the thickness of the substrate and also the material and the thickness of the conductor tracks can be chosen such that the base has a coefficient of thermal expansion that is adapted to the coefficient of thermal expansion of the multilayer capacitor. In particular, the coefficient of thermal expansion of the base can differ from the coefficient of thermal expansion of the multilayer capacitor by less than 0.5 ppm/K, preferably by less than 0.1 ppm/K. Adapting the coefficients of thermal expansion to one another can ensure that even in the event of temperature changes the capacitor assembly is not subjected to high mechanical stresses which would otherwise arise as a result of different expansions of base and multilayer capacitor. The coefficient of thermal expansion of the base is determined by the ratio of the quantity of material of the substrate to the quantity of material of the conductor tracks. By means of a corresponding choice of this ratio, it is possible to set the coefficient of thermal expansion to a desired value.

The multilayer capacitor can have for example a coefficient of thermal expansion of 10 ppm/K. The multilayer capacitor can substantially consist of a ceramic material having a coefficient of thermal expansion of 3 ppm/K, for example, and internal electrodes consisting of copper, for example, and having a significantly higher coefficient of thermal expansion. The coefficient of thermal expansion of the multilayer capacitor can also be set in a desired manner by the ratio of the quantity of the ceramic material and the quantity of material of the internal electrodes being chosen accordingly.

As material for the substrate of the base it is possible to choose silicon nitride, for example, which has a coefficient of thermal expansion of 2.5 ppm/K. As material for the substrate it is alternatively possible to choose aluminum oxide, which has a coefficient of thermal expansion of 6.8 ppm/K. By setting the thickness of a copper layer forming the conductor tracks of the base, and by setting the thickness of the substrate, it is then possible to adapt the coefficient of thermal expansion of the base to the capacitor. In this regard, by way of example, a comparatively thin copper layer would be chosen in the case of a substrate composed of aluminum oxide and a comparatively thick copper layer in the case of a substrate composed of silicon nitride.

The base and the multilayer capacitor can have the same width. Accordingly, the width of the capacitor assembly can correspond to the width of the multilayer capacitor. Consequently, it is not necessary to increase the width for securing the multilayer capacitor on a printed circuit board. As a result, the structural space requirement of the capacitor assembly can be limited to the extents of the multilayer capacitor.

The same width should be understood here to mean that the widths of the base and of the multilayer capacitor differ from one another merely in the context of the customary production tolerances. Accordingly, the width of the base can deviate from the width of the multilayer capacitor by less than 0.1 mm.

The substrate can comprise silicon nitride, aluminum oxide or aluminum nitride. Silicon nitride is distinguished in particular by a high thermal conductivity of 30 W/mK. Aluminum oxide has a thermal conductivity of 20 W/mK. The substrate can have a thickness of between 0.1 mm and 2.0 mm.

The conductor tracks can consist of copper. The conductor tracks can have a thickness of between 0.05 mm and 1.0 mm. The thickness of the conductor tracks should not be chosen to be smaller than 0.05 mm, in order to ensure a good electrical conductivity.

Advantageous aspects of the present invention are mentioned below. In order to be able to better reference the aspects among one another, the aspects are numbered.

1. A capacitor assembly comprising
   at least one ceramic multilayer capacitor comprising ceramic layers and first and second electrodes arranged therebetween, and
   a base comprising a substrate and conductor tracks wherein the conductor tracks lead from a top side of the substrate, said top side facing toward the multilayer capacitor, to an underside of the substrate, said underside facing away from the multilayer capacitor, wherein the multilayer capacitor is mechanically secured on the base and wherein the first electrodes and the second electrodes are electrically contacted with the conductor tracks.
2. The capacitor assembly according to the preceding aspect,
   wherein the multilayer capacitor comprises a first external contact and a second external contact, which are arranged on one and the same outer surface of the multilayer capacitor,
   wherein the first electrodes are connected to one of the conductor tracks via the first external contact, and
   wherein the second electrodes are connected to one of the conductor tracks via the second external contact.
3. The capacitor assembly according to any of the preceding aspects,
   wherein the multilayer capacitor bears by at least half of the first outer surface directly on the base.
4. The capacitor assembly according to any of the preceding aspects,
   wherein the ceramic multilayer capacitor is connected to the base by a layer comprising silver.
5. The capacitor assembly according to any of the preceding aspects,
   wherein the ceramic multilayer capacitor is connected to the base by a layer formed by applying a paste and subsequent sintering.
6. The capacitor assembly according to any of the preceding aspects,
   wherein a second ceramic multilayer capacitor comprising ceramic layers and electrodes arranged therebetween is arranged on the base, and
   wherein the electrodes of the second multilayer capacitor are electrically contacted with the conductor tracks.
7. The capacitor assembly according to the preceding aspect,
   wherein the base comprises at least one slot extending between the ceramic multilayer capacitor and the second ceramic multilayer capacitor.
8. The capacitor assembly according to either of aspects 6 and 7,
   wherein the ceramic multilayer capacitor and the second ceramic multilayer capacitor are connected in parallel with one another.
9. The capacitor assembly according to any of the preceding aspects,
   wherein the capacitor assembly is an SMD device.
10. The capacitor assembly according to any of the preceding aspects,
    wherein the material and the thickness of the substrate and also the material and the thickness of the conductor tracks are chosen such that the base has a coefficient of thermal expansion that is adapted to the coefficient of thermal expansion of the multilayer capacitor.
11. The capacitor assembly according to any of the preceding aspects,
    wherein the base and the multilayer capacitor have the same width.
12. The capacitor assembly according to any of the preceding aspects,
    wherein the substrate comprises silicon nitride, aluminum oxide or aluminum nitride.
13. The capacitor assembly according to any of the preceding aspects,
    wherein the substrate has a thickness of between 0.1 mm and 2.0 mm.
14. The capacitor assembly according to any of the preceding aspects,
    wherein the conductor tracks consist of copper.
15. The capacitor assembly according to any of the preceding aspects,
    wherein the conductor tracks have a thickness of between 0.05 mm and 1.0 mm.

The invention is explained in greater detail below with reference to the figures.

FIG. 11 shows the base in a view from the front.

FIG. 12 shows a tabular overview of simulation results which compares different properties of different capacitor assemblies according to the invention with a comparative capacitor assembly.

Figure 1:
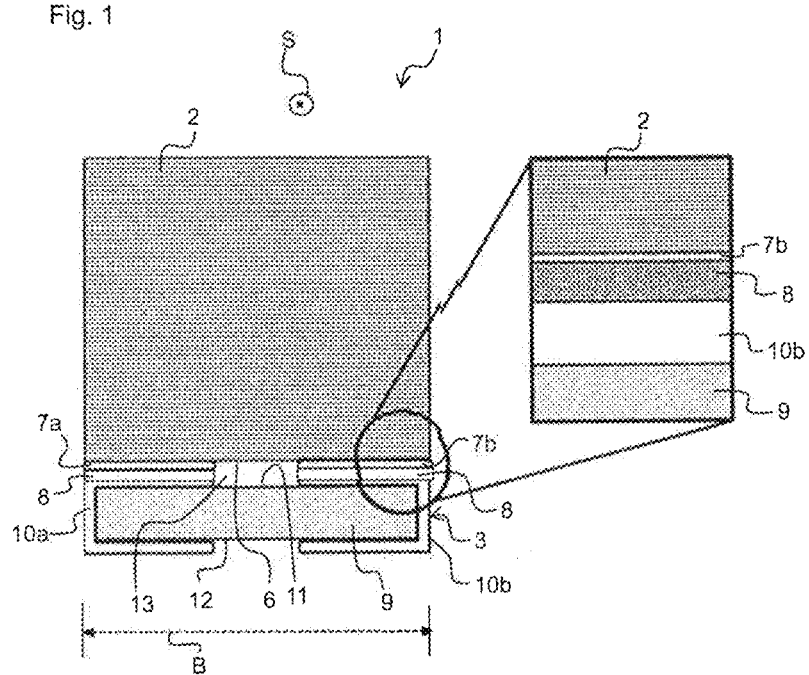
FIG. 1 shows a cross section through a capacitor assembly.

FIG. 1 shows a cross section through a capacitor assembly 1. The capacitor assembly 1 comprises a ceramic multilayer capacitor 2 and a base 3. Furthermore, FIG. 1 shows an enlarged excerpt from the cross section, which makes it possible to discern details of the capacitor assembly 1.

The ceramic multilayer capacitor 2 comprises ceramic layers 4 stacked one above another and electrodes 5*a*, 5*b*, 5*c* arranged therebetween. Various exemplary embodiments of the construction of the ceramic multilayer capacitor 2 will be explained later with reference to FIGS. 2 to 7. On a first outer surface 6 directed toward the base 3, the ceramic multilayer capacitor 2 comprises two external contacts 7*a*, 7*b*. The electrodes 5*a*, 5*b* are electrically connected to the external contacts 7*a*, 7*b*. Accordingly, the multilayer capacitor 2 is provided for a single-sided connection. The hatching shown in FIG. 1 does not illustrate the course of the electrodes 5a, 5b, 5c, but rather serves merely to enable the multilayer capacitor 2 to be better differentiated from further elements of the capacitor assembly 1.

In particular, the electrodes 5a, 5b and a piezoelectric material are stacked in the ceramic multilayer capacitor 2 in such a way that an electrode 5a connected to one external contact 7a and an electrode 5b connected to the other external contact 7b respectively alternate in a stacking direction S, and that a layer of the piezoelectric material is arranged between each two electrodes 5a, 5b.

The external contacts 7a, 7b have a thickness of between 0.1 µm and 1 µm. The term "thickness" here denotes the extent of the respective layer in a direction that is parallel to the direction of the surface normal to the first outer surface 6 of the multilayer capacitor 2.

The multilayer capacitor 2 is mechanically connected to the base 3. This connection is produced by means of a layer 8 comprising silver. In particular, the layer 8 can consist of pure silver to the extent of 95% by weight or even to the extent of 99% by weight. The layer 8 connecting the multilayer capacitor 2 to the base 3 is formed by sintering a paste. The process in which the multilayer capacitor 2 is secured to the base 3 is also referred to as silver sintering technology. The layer 8 furthermore produces an electrical contact between the external contacts 7a, 7b of the multilayer capacitor 2 and the base 3. The layer 8 comprising silver has a thickness of between 5 µm and 50 µm.

The base 3 comprises a substrate 9 and conductor tracks 10a, 10b. The substrate 9 consists of a ceramic or dielectric material, for example of silicon nitride, aluminum oxide or aluminum nitride. The substrate 9 has a parallelepipedal shape, wherein a top side 11 of the substrate 9 faces toward the multilayer capacitor 2 and wherein an underside 12 of the substrate 9 faces away from the multilayer capacitor 2. The substrate 9 has a thickness of between 0.2 mm and 1.0 mm.

The conductor tracks 10a, 10b extend on the surface of the substrate 9 from the top side 11 of the substrate 9 toward the underside 12 of the substrate 9. The conductor tracks 10a, 10b consist of a conductive material, for example of copper. The conductor tracks 10a, 10b have a thickness of between 0.1 mm and 0.6 mm.

In particular, the base 3 comprises a first conductor track 10a and a second conductor track 10b. On the top side 11 of the substrate 9, a cavity 13 filled with air is situated between the two conductor tracks 10a, 10b. The distance between the two conductor tracks 10a, 10b is large enough that an electrical flashover between the first and second conductor tracks 10a, 10b does not occur. In particular, the distance between the two conductor tracks 10a, 10b is chosen such that creepage path requirements made of the capacitor assembly 1 are satisfied. On the underside 12 of the substrate 9 as well the two conductor tracks 10a, 10b are at a sufficient distance from one another that an electrical flashover between the two conductor tracks 10a, 10b cannot occur.

The base 3 is a so-called DCB component (DCB=direct copper bonding), which sometimes is also referred to as a DBC component (DBC=direct bonded copper). These components are suitable for surface mounting on a printed circuit board. Accordingly, the capacitor assembly 1 is an SMD device (SMD=surface mounted device). If the capacitor assembly 1, comprising the multilayer capacitor 2 and the base 3, is secured on a printed circuit board by means of surface mounting, then for this purpose the conductor tracks 10a, 10b arranged on the underside 12 of the substrate 9 can be connected to the printed circuit board for example by means of a soldering connection or by means of a connection layer produced by sintering silver technology.

The multilayer capacitor 2 and the base 3 have an identical width B. In this case, the width B indicates the extent of the multilayer capacitor 2 and of the base 3, respectively, in a spatial direction that is perpendicular to a surface normal to the first outer surface 6 of the multilayer capacitor 2 and that is furthermore perpendicular to a stacking direction S in which the electrodes 5a, 5b, 5c and the ceramic layers 4 are stacked one above another in the multilayer capacitor 2. In this case, the stacking direction S points out of the plane of the drawing in FIG. 1.

Figure 2:
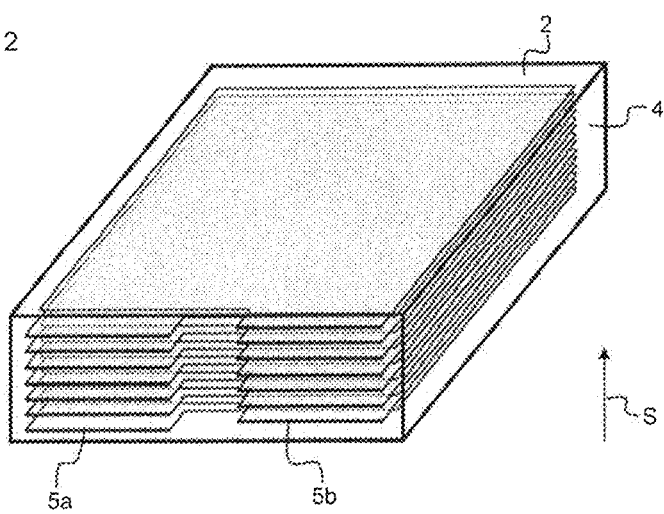
FIGS. 2 to 4 show an electrode configuration of a multilayer capacitor in accordance with a first exemplary embodiment.
Figure 3:
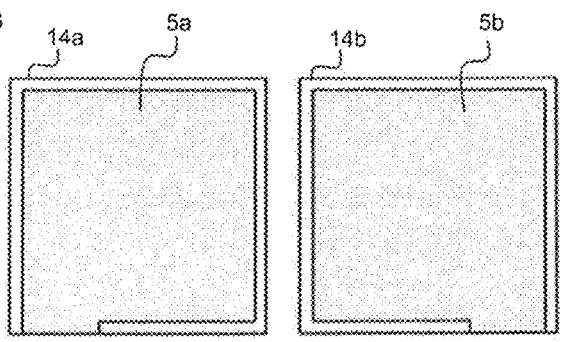
Figure 4:
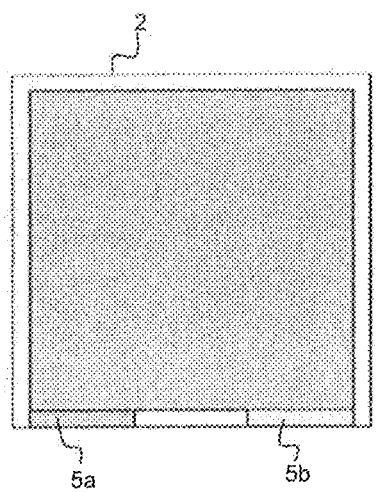

FIGS. 2 to 4 show an electrode configuration of the multilayer capacitor 2 in accordance with a first exemplary embodiment. The electrode configuration enables a single-sided connection of the multilayer capacitor 2, wherein the electrodes 5a, 5b are contacted with the external contacts 7a, 7b arranged on the first outer surface 6 of the multilayer capacitor 2. FIG. 2 shows the multilayer capacitor 2 in a perspective view. FIG. 3 shows a single first electrode layer 14a, in which a first electrode 5a is arranged, and a single second electrode layer 14b, in which a second electrode 5b is arranged. The first and the second electrode layers 14a, 14b are alternately stacked one above another in the multilayer capacitor 2, wherein a respective ceramic layer 4 is arranged between two electrode layers 14a, 14b. FIG. 4 shows the multilayer capacitor 2 in plan view.

In accordance with the first exemplary embodiment, the multilayer capacitor 2 comprises first electrodes 5a and second electrodes 5b. A first electrode 5a is shown in the left-hand illustration in FIG. 3. In this case, an end of the first electrode 5a is led out to the first outer surface 6 of the multilayer capacitor 2 and connected to the first external contact 7a. The first electrode 5a is not connected to the second external contact 7b.

A second electrode 5b is shown in the right-hand illustration in FIG. 3. The second electrodes 5b are connected to the second external contact 7b. An end of the second electrodes 5b bears against the first outer surface 6. In an orthogonal projection in the stacking direction S, the first electrodes 5a and the second electrodes 5b extend in wide regions, but not in the ends which are connected to the first outer surface 6. The overlapping areas of the first and the second electrodes 5a, 5b are clearly discernible in particular in the plan view shown in FIG. 4.

Figure 5:
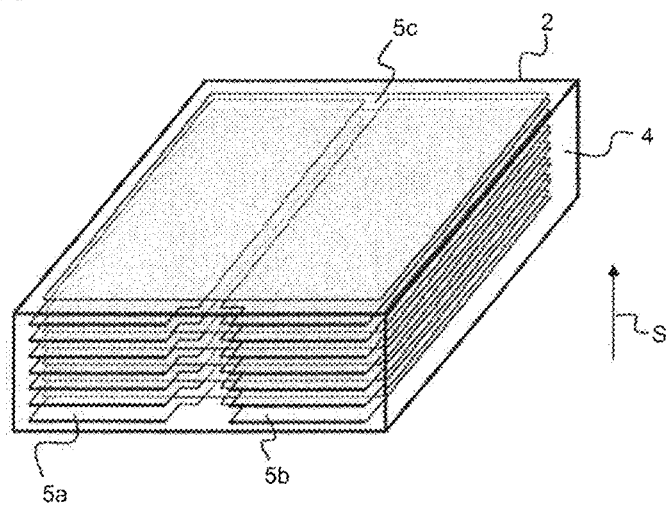
FIGS. 5 to 7 show an electrode configuration of a multilayer capacitor in accordance with a second exemplary embodiment.
Figure 6:
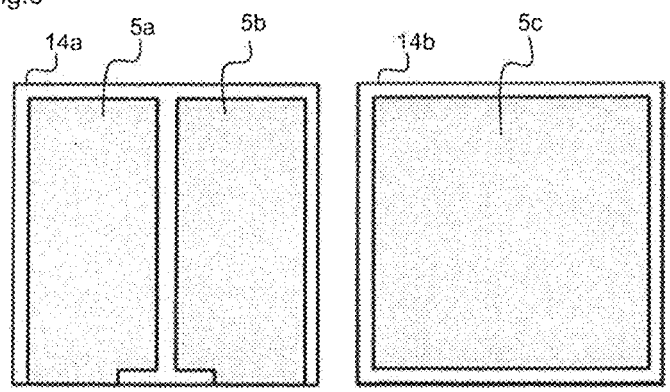
Figure 7:
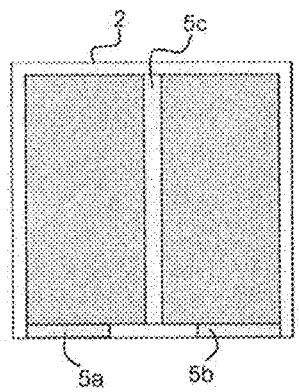

FIGS. 5 to 7 show a second exemplary embodiment of an electrode configuration of the multilayer capacitor 2. FIG. 5 shows the electrode configuration in the multilayer capacitor 2 in perspective view. FIG. 6 shows a single first electrode layer 14a, in which a first electrode 5a and a second electrode 5b are arranged, and a single second electrode layer 14b, in which a third electrode 5c is arranged. The first and the second electrode layers 14a, 14b are alternately stacked one above another in the multilayer capacitor 2, wherein a respective ceramic layer 4 is arranged between two electrode layers 14a, 14b. FIG. 4 shows the multilayer capacitor 2 in plan view.

In accordance with the second exemplary embodiment, the multilayer capacitor thus comprises first electrodes 5a, second electrodes 5b and third electrode 5c. The first electrodes 5a and the second electrodes 5b are arranged in the first electrode layer 14a. In this case, an end of the first electrodes 5a is respectively connected to the first external contact 7a on the first outer surface 6 of the multilayer capacitor 2. An end of the second electrodes 5b is connected to the second external contact 7b on the first outer surface 6. The first electrodes 5a and the second electrodes 5b do not touch one another.

Furthermore, the multilayer capacitor 2 comprises the third electrodes 5c, which are arranged in the second electrode layers 14b. The third electrodes 5c are not connected to any of the external contacts 7a, 7b. The third electrodes 5c overlap both the first electrodes 5a and the second electrodes 5b in an orthogonal projection in the stacking direction S. Accordingly, two internal capacitors connected in series are formed in the multilayer capacitor 2. In this case, a first internal capacitor is formed by the first and the third electrodes 5a, 5c and a second internal capacitor is formed by the second and the third electrodes 5b, 5c. An MLSC capacitor (MLSC=multi layer serial capacitor) is involved.

Figure 8:
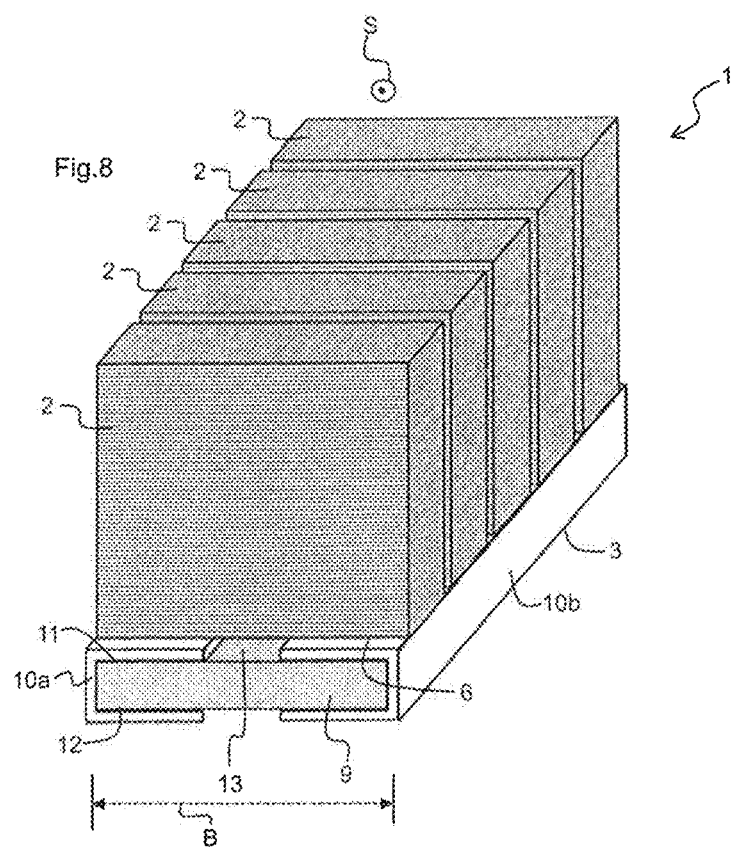
FIG. 8 shows a further exemplary embodiment of a capacitor assembly.

FIG. 8 shows a further exemplary embodiment of the capacitor assembly 1.

In accordance with the further exemplary embodiment, the capacitor assembly 1 comprises a plurality of multilayer capacitors 2. In this case, the multilayer capacitors 2 can have the structural and functional features that were disclosed in association with FIGS. 1 to 7 for the one multilayer capacitor 2. The multilayer capacitors 2 are in each case mechanically and electrically connected by a first outer surface 6 to the conductor tracks of the base 3. The multilayer capacitors 2 are interconnected in parallel with one another.

The multilayer capacitors 2 are arranged one behind another in a direction corresponding to the stacking direction S of the multilayer capacitors 2. The multilayer capacitors 2 and the base 3 have an identical width B.

Figure 9:
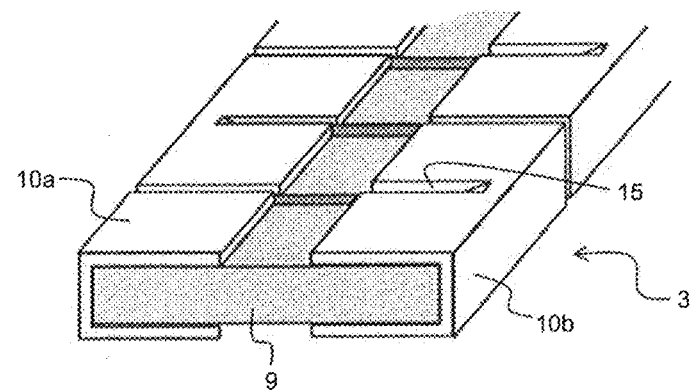
FIG. 9 shows a base in a perspective view.

FIG. 9 shows the base 3 in a perspective view. The base 3 comprises slots 15. The slots 15 can contribute to the mechanical load relief of the base 3. By way of example, the slots 15 can reduce mechanical stresses that can arise as a result of differences between the coefficients of thermal expansion of the multilayer capacitors 2 and the coefficient of thermal expansion of the base 3.

If the capacitor assembly 1 comprises a plurality of multilayer capacitors 2 arranged on the base 3, then the slots 15 can be arranged in each case between two multilayer capacitors 2. A significant reduction of the thermal conductivity of the connection of the base 3 to a printed circuit board should not be expected as a result of the slots 15 in the case of surface mounting of the capacitor assembly 1, since the area by which the base 3 is linked on a printed circuit board is not significantly reduced by the slots 15.

Furthermore, it is possible to produce a multiplicity of capacitor assemblies 1 jointly. In this case, a multiplicity of multilayer capacitors 2 can be arranged on a single base 3 comprising slots 15. The base 3 can then be singulated into a plurality of components along the slots 15. The slots 15 can thus be used as predetermined breaking locations during a production method.

Figure 10:
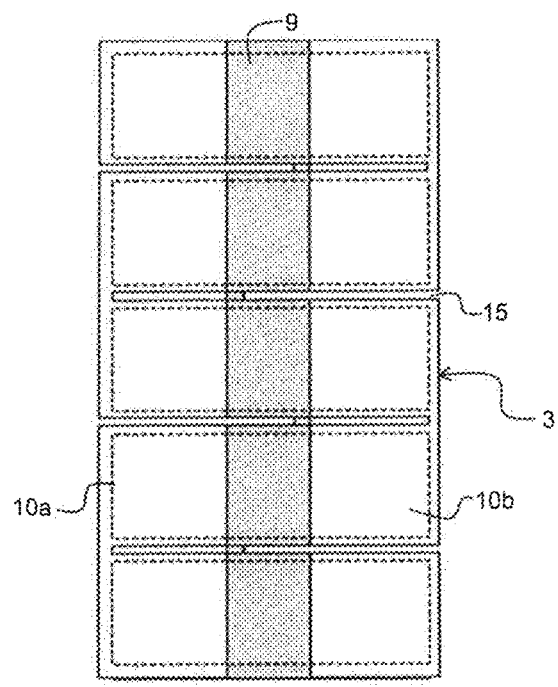
FIG. 10 shows the base shown in FIG. 9 in a plan view.

FIG. 10 shows the base 3 shown in FIG. 9 in a plan view. FIG. 11 shows the base 3 in a view from the front.

FIG. 12 shows a tabular overview of simulation results which compares different properties of the capacitor assembly 1 according to the invention with a comparative capacitor assembly. In the case of the comparative capacitor assembly, a multilayer capacitor comprises a sintered silver layer, which is connected to an external electrode of a multilayer capacitor, and a copper frame secured to the sintered silver layer. The copper frame is rectangularly shaped and enables the contacting of the comparative capacitor assembly at a printed circuit board.

A capacitor assembly 1 according to the invention is considered in each case in the second to fifth columns. The comparative capacitor assembly described above is considered in the sixth column. Each of the capacitor assemblies comprises a single multilayer capacitor 2, wherein the number and the thickness of the electrodes 5s, 5b, 5c in the multilayer capacitors 2 are identical for all the capacitor assemblies 1.

On the basis of the simulation results shown in FIG. 12 it can be discerned that the thermal resistance, or the thermal conductivity resulting as the reciprocal of the thermal resistance, in the case of the capacitor assembly 1 according to the invention is similar and in some instances even better than in the case of the comparative capacitor assembly comprising solid metallic conductors. With respect to the comparative capacitor assembly, the capacitor assemblies 1 according to the invention are distinguished by a smaller structural space requirement and a larger surface for linking to a printed circuit board. In particular the bottommost row of the table reveals that the structural space requirement is considerably reduced in the case of the capacitor assemblies 1 according to the invention. This is attributable in particular to the fact that the use of the base 3 on which the multilayer capacitor 2 is secured makes it possible to design a capacitor assembly 1 whose width B is identical to the width of the multilayer capacitor 2. In the case of the comparative capacitor assembly, by contrast, the width of the assembly has to be significantly larger than the width of the multilayer capacitor since the width is increased by the copper frame.

LIST OF REFERENCE SIGNS 1 capacitor assembly
2 multilayer capacitor
3 base
4 ceramic layer
5a electrode
5b electrode
5c electrode
6 first outer surface
7a external contact
7b external contact
8 layer
9 substrate
10a conductor track
10b conductor track
11 top side of the substrate
12 underside of the substrate
13 cavity
14a first electrode layer
14b second electrode layer
15 slot
B width
S stacking direction

The invention claimed is:
1. A capacitor assembly comprising
a plurality of multilayer capacitors including a first multilayer capacitor and a second multilayer capacitor, each comprising ceramic layers and first and second electrodes arranged therebetween, and
a base comprising a substrate and conductor tracks wherein the conductor tracks lead from a top side of the substrate, said top side facing toward the plurality of multilayer capacitors, to an underside of the substrate, said underside facing away from the plurality of multilayer capacitors, wherein the base further comprises at least one slot extending between the first and second multilayer capacitors without cutting the base into two separate parts, wherein each of the plurality of multilayer is capacitors are mechanically secured on the base and wherein the first and second electrodes are electrically contacted with the conductor tracks, wherein each of the plurality of multilayer capacitors comprise external contacts arranged on an outer surface facing toward the base to provide a single-sided connection.

2. The capacitor assembly according to claim 1,
wherein the first and the second electrodes of each of the plurality of multilayer capacitors bear against the outer surface facing toward the base.

3. The capacitor assembly according to claim 1,
wherein each of the plurality of multilayer capacitors comprises a first external contact and a second external contact, which are arranged on the outer surface,
wherein the first electrodes are connected to one of the conductor tracks via the first external contact, and
wherein the second electrodes are connected to one of the conductor tracks via the second external contact.

4. The capacitor assembly according to claim 1,
wherein each of the plurality of multilayer capacitors bears by at least half of a first outer surface directly on the base.

5. The capacitor assembly according to claim 1,
wherein each of the plurality of multilayer capacitors is connected to the base by a layer comprising silver.

6. The capacitor assembly according to claim 1,
wherein each of the plurality of multilayer capacitors is connected to the base by a layer formed by applying a paste and subsequent sintering.

7. The capacitor assembly according to claim 1,
wherein the first multilayer capacitor and the second multilayer capacitor are connected in parallel with one another.

8. The capacitor assembly according to claim 1,
wherein the capacitor assembly is an SMD device.

9. The capacitor assembly according to claim 1,
wherein the material and the thickness of the substrate and also the material and the thickness of the conductor tracks are chosen such that the base has a coefficient of thermal expansion that is adapted to a coefficient of thermal expansion of the plurality of multilayer capacitors.

10. The capacitor assembly according to claim 1,
wherein the base and the plurality of multilayer capacitors have a same width.

11. The capacitor assembly according to claim 1,
wherein the substrate comprises silicon nitride, aluminum oxide or aluminum nitride.

12. The capacitor assembly according to claim 1,
wherein the conductor tracks consist of copper.

13. The capacitor assembly according to claim 1,
wherein the conductor tracks have a thickness of between 0.05 mm and 1.0 mm.

* * * * *